(12) United States Patent
Yang

(10) Patent No.: US 8,891,244 B2
(45) Date of Patent: Nov. 18, 2014

(54) HINGE ASSEMBLY

(71) Applicant: Wistron Corporation, New Taipei (TW)

(72) Inventor: Chun-Fei Yang, New Taipei (TW)

(73) Assignee: Wistron Corporation, New Taipei (TW)

( * ) Notice: Subject to any disclaimer, the term of this patent is extended or adjusted under 35 U.S.C. 154(b) by 203 days.

(21) Appl. No.: 13/711,728

(22) Filed: Dec. 12, 2012

(65) Prior Publication Data

US 2013/0182403 A1 Jul. 18, 2013

Related U.S. Application Data

(60) Provisional application No. 61/586,431, filed on Jan. 13, 2012.

(30) Foreign Application Priority Data

Jun. 1, 2012 (TW) .............................. 101119841 A

(51) Int. Cl.
*H05K 5/00* (2006.01)
*G06F 1/16* (2006.01)
*H05K 5/02* (2006.01)

(52) U.S. Cl.
CPC ............ *G06F 1/1681* (2013.01); *H05K 5/0226* (2013.01); *G06F 1/1683* (2013.01)
USPC .................. 361/755; 361/679.27; 361/679.28

(58) Field of Classification Search
USPC ..................... 361/755, 807, 809, 810, 679.06, 361/679.12, 679.27, 679.28; 16/342, 285, 16/307, 308, 374, 293, 295; 455/575.3
See application file for complete search history.

(56) References Cited

U.S. PATENT DOCUMENTS

| 5,751,544 | A  | * | 5/1998  | Song .......................... 361/679.09 |
| 6,704,966 | B1 | * | 3/2004  | Kao ................................. 16/252 |
| 7,142,898 | B2 | * | 11/2006 | Takagi ........................ 455/575.3 |
| 7,207,086 | B2 | * | 4/2007  | Yang ............................... 16/366 |
| 2006/0005354 | A1 | * | 1/2006 | Nada et al. ...................... 16/221 |

FOREIGN PATENT DOCUMENTS

| TW | 315953 M | 7/2007 |
| TW | 368285 M | 11/2009 |
| TW | 411089 M | 9/2011 |
| TW | 413312 M | 10/2011 |
| TW | M413312 U | 10/2011 |

OTHER PUBLICATIONS

Taiwan Office Action Issued Jun. 23, 2014.

* cited by examiner

*Primary Examiner* — Hung S Bui
(74) *Attorney, Agent, or Firm* — Rabin & Berdo, P.C.

(57) ABSTRACT

A hinge assembly is provided for a signal cable to pass through. The hinge assembly includes a first bearing block, a second bearing block, and a spindle. The first bearing block includes a first fixing plate and a first sleeve, the first sleeve is connected to a side edge of the first fixing plate, and the first sleeve has a first sectioned groove linked to its two ends. One end of the spindle is inserted in the first sleeve, and the other end is fixed on the second bearing block. The spindle has a second sectioned groove, and the second sectioned groove has at least one end linked to the first sectioned groove of the first sleeve, so that one end of the first sleeve, the first sectioned groove, and the second sectioned groove are linked to form an accommodating space for signal cables to pass through.

40 Claims, 16 Drawing Sheets

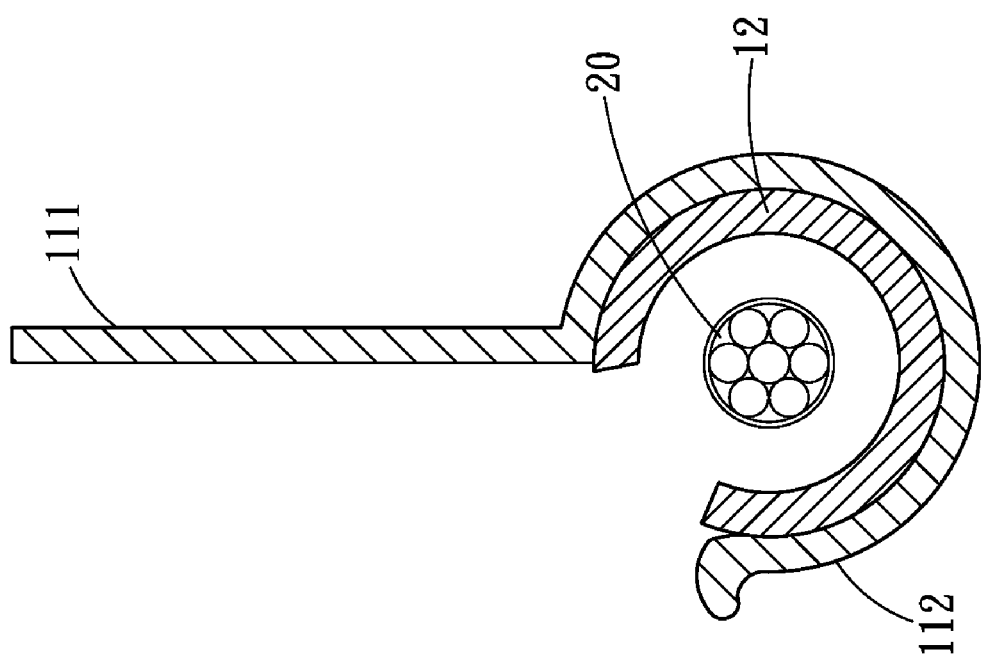

HINGE ASSEMBLY

CROSS-REFERENCES TO RELATED APPLICATIONS

This non-provisional application claims priorities under 35 U.S.C. §119(e) and 119(a) on Patent Application No. 61/586,431 filed in United States on Jan. 13, 2012 and Patent Application No. 101119841 filed in Taiwan, R.O.C. on Jun. 1, 2012, the entire contents of which are hereby incorporated by reference.

BACKGROUND OF THE INVENTION

1. Technical Field

The present invention relates to a hinge assembly, and in particular, to a hinge assembly for a signal cable to pass through.

2. Related Art

At present, there are a variety of designs of portable computers. To reduce the volume of the notebook computer and increase portability, the thickness of the portable computer is becoming steadily reduced. How to properly arrange the electronic components in a reduced usable space, is a significant challenge for portable computer designers.

In a portable computer, the hinge assembly is used for pivotally connecting the main unit and the display screen. In a conventional design concept, the hinge assembly is only used for connection, and therefore, for the arrangement of all electronic components, only the internal space of the computer case is taken into consideration while the mutual interferences between the electronic components and the hinge assembly need to avoided.

Conventional signal cables are wound around the pivot from the main unit base and are then connected to the display screen, which is already inapplicable to ultrabooks or similar portable products. The pivot not only needs to become lighter and thinner with the overall volume, and the size also needs to become smaller, while the torsion and rigid structure still need to be kept. Therefore, in the prior art, a method in which a part of the signal cables are hidden in the hollow axial space of the pivot is developed.

In the conventional technology, the spindle of the hinge assembly is designed hollow, and the signal cables pass through the hollow spindle. However, the volumes of the connectors at two ends of the wire of the signal cable are usually bigger than the pipe diameter of the hollow spindle, so that during the assembly process the wire of the signal cable is placed through the spindle first and then the connectors are joined with the two ends of the wire through welding or in other manners. However, signal cables and pivot assemblies are usually provided by different suppliers, so the assembly requires the following two manners. In the first manner, a site is added in the assembly factory to place the wire through the spindle, the connectors are then joined with the two ends of the wire, and subsequent assembly is performed. In the second manner, the assembly factory obtains the hinge assembly and the signal cables and contracts with component suppliers to place the wire through the spindle and join the two ends of the wire to the connectors, and then send the components back to the assembly factory to perform the assembly. However, the first manner makes the assembly process too cumbersome and results in low-efficiency assembly, while the second manner has the troubles of secondary delivery and is not cost-effective.

SUMMARY

In view of the above, the present invention provides a hinge assembly for a signal cable to pass through, the two ends of the signal cable are disposed with an electrical connector, respectively, and the hinge assembly includes a first bearing block and a spindle. The first bearing block includes a first fixing plate and a first sleeve, in which the first sleeve is connected to a side edge of the first fixing plate, and the first sleeve has a first sectioned groove that links two ends of the first sleeve. One end of the spindle is inserted in the first sleeve, the spindle includes a second sectioned groove, and the second sectioned groove has at least one end linked to the first sectioned groove of the first sleeve, making one end of the first sleeve, the first sectioned groove, and the second sectioned groove linked to form an accommodating space for signal cables to pass through.

In addition, another embodiment of the present invention includes a second bearing block which includes a second fixing plate and a first tongue. The first tongue vertically extends to the second fixing plate, the first tongue has a first through hole, and the other end of the spindle is inserted in the first through hole.

In conclusion, the hinge assembly according to the present invention can be used for a signal cable with an electrical connector at two ends respectively to pass through. As portable computers become increasingly lighter, thinner, shorter, and smaller nowadays, a thin-type solution provided by relevant designers mitigates the problems in the prior art.

BRIEF DESCRIPTION OF THE DRAWINGS

The present invention will become more fully understood from the detailed description given herein below for illustration only, and thus are not limitative of the present invention, wherein:

FIG. 3 is a schematic sectional view along a section line AA in FIG. 2A;

DETAILED DESCRIPTION

Figure 1:
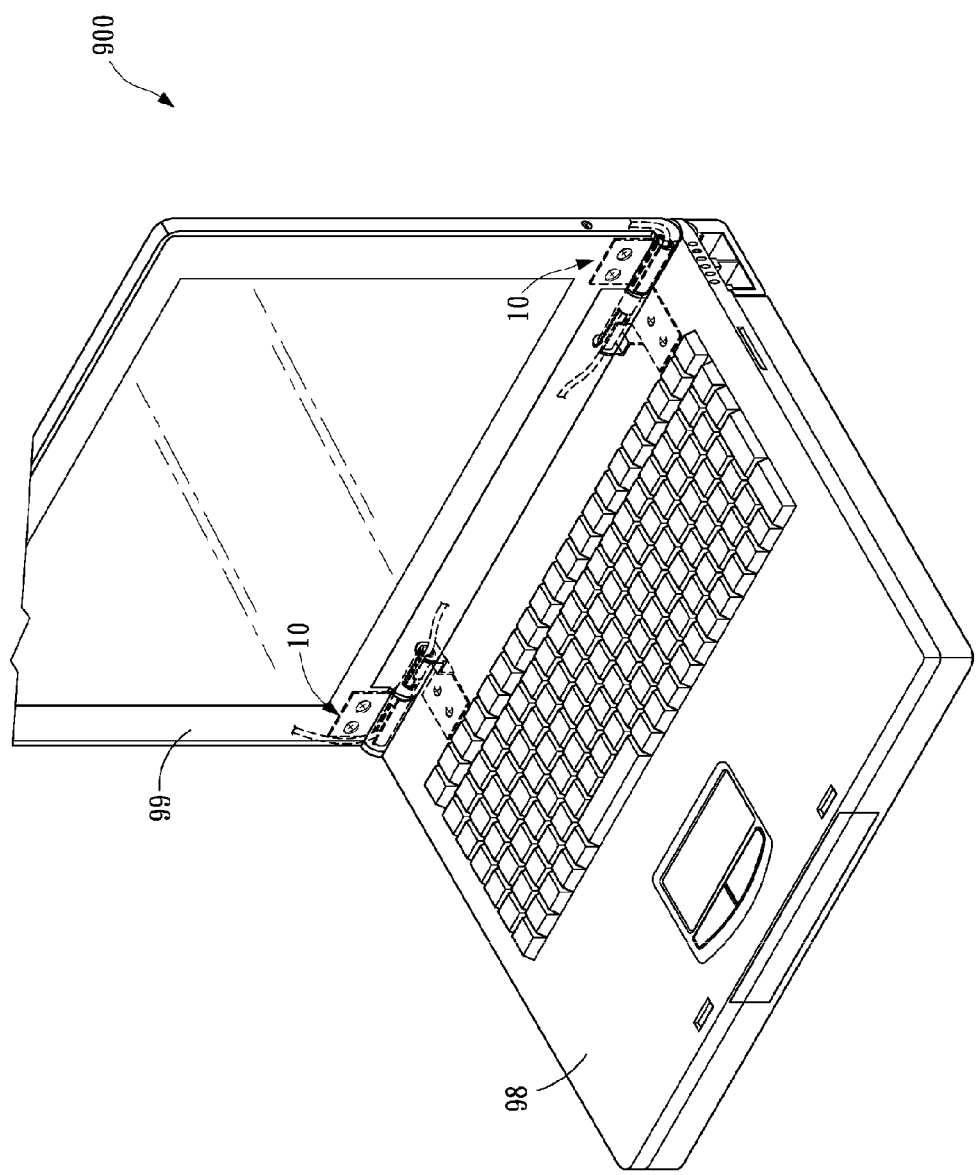
FIG. 1 is a reference diagram of a use state according to a first embodiment of the present invention.
Figure 2A:
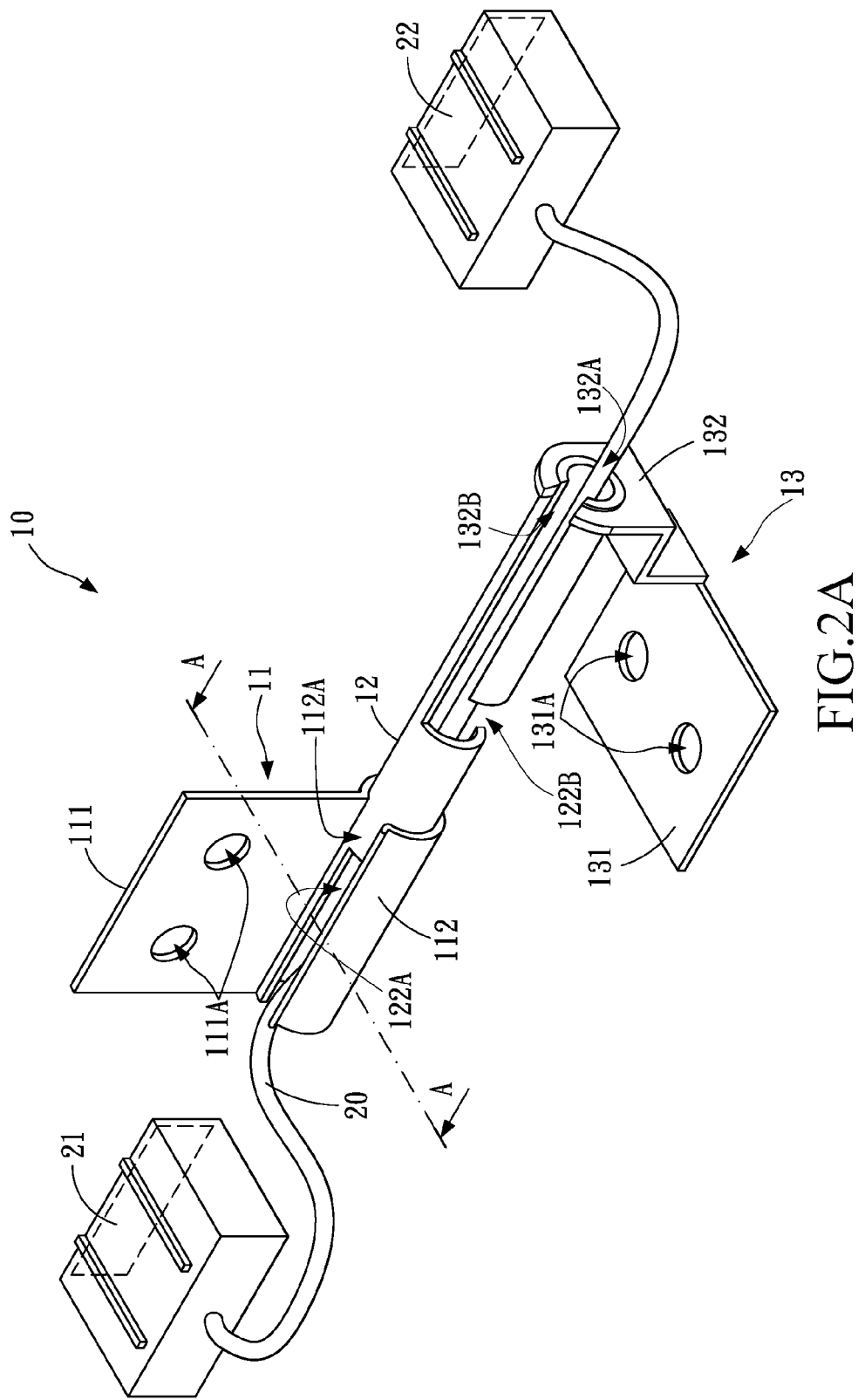
FIG. 2A is a schematic view (1) of a first embodiment of the present invention.

Please refer to FIG. 1 to FIG. 3, FIG. 1 to FIG. 3 which are a reference diagram of a use state, a schematic view (1), a schematic view (2), and a schematic sectional view along a section line AA in FIG. 2A according to a first embodiment of the present invention, respectively, in which a hinge assembly 10 is specifically disclosed. The hinge assembly 10 is installed on an electronic device of a notebook computer 900 in FIG. 1, and the notebook computer 900 includes a main unit base 98 having a keyboard and a display screen 99. One end of the hinge assembly 10 is fixed at the rear edge of the main unit base 98, and the other end is joined with the display screen 99 at the bottom edge near the main unit base 99 in a rotatable manner, so that the display screen 99 can rotate relative to the main unit base 98.

The hinge assembly 10 can make the display screen 99 be rotated relative to the main unit base 98 as described above, and can be used for a signal cable 20 that transmits a video signal and a control signal from the main unit base 98 to the display screen 99 to pass through. The two ends of the signal cable 20 are disposed with an electrical connector 21 and an electrical connector 22, respectively. The electrical connector 21 can be connected to a corresponding electrical connector of a display control circuit board of the display screen 99, the electrical connector 22 can be connected to a corresponding electrical connector of a main circuit board of the main unit base 98, and a part of the wire of the signal cable 20 can pass through the hinge assembly 10. The hinge assembly 10 includes a first bearing block 11 and a spindle 12.

The first bearing block 11 has a first fixing plate 111 and a first sleeve 112, in which the first fixing plate 111 can be locked on the display screen 99 by a screw through a screw hole 111A, and the first sleeve 112 is connected to a side edge of the first fixing plate 111, or is integrally formed from a side edge of the first fixing plate 111. The first sleeve 112 is hollow and has a first sectioned groove 112A that extends axially and is linked to the hollow space, and the first sectioned groove 112A in this example is linked to the two open ends of the first sleeve 112, so that the first sleeve 112 has a C-shaped cross section.

The outside diameter of one end of the spindle 12 is not bigger than the inside diameter of the first sleeve 112 and is inserted in the first sleeve 112, forming an enclosed, tightly fitted, rotational combination. The spindle 12 in this embodiment is hollow and has a second sectioned groove 122A that is in an axial direction and runs through two ends. The second sectioned groove 122A has two radial cutting grooves 122B disposed at an interval and a third sectioned groove 122D axially disposed at proper positions in the middle, forming a U bend, in which the third sectioned groove 122D and the second sectioned groove 122A are staggered and are not in a single straight line, and the second sectioned groove 122A, two cutting grooves 122B, and the third sectioned groove 122D are linked. Accordingly, when the spindle 12 is inserted in the first sleeve 112 with the second sectioned groove 122A aligning with the first sectioned groove 122A, an open end of the first sleeve 112, the first sectioned groove 112A, the second sectioned groove 122A, the two cutting groove 122B, the third sectioned groove 122D are linked to form a link channel 123 for the link to the hollow space inside. Therefore, the wire body of the signal cable 20 can be directly pressed in the link channel in a manner of being nearly parallel to the axial direction of the spindle 12 to be accommodated in the hollow space inside, and the signal cable 20 is easily joined with the hinge assembly 10, which is shown in FIG. 2.

In the embodiment, the hinge assembly 10 further includes a second bearing block 13, and the second bearing block 13 includes a second fixing plate 131 and a first tongue 132. The second fixing plate 131 can be locked on the main unit base 98 by a screw through a screw hole 131A, and the first tongue 132 vertically extends to the second fixing plate 131. The first tongue 132 has a C-shaped first through hole, and the other end of the spindle 12 is inserted in the first through hole 132A.

Figure 2B:
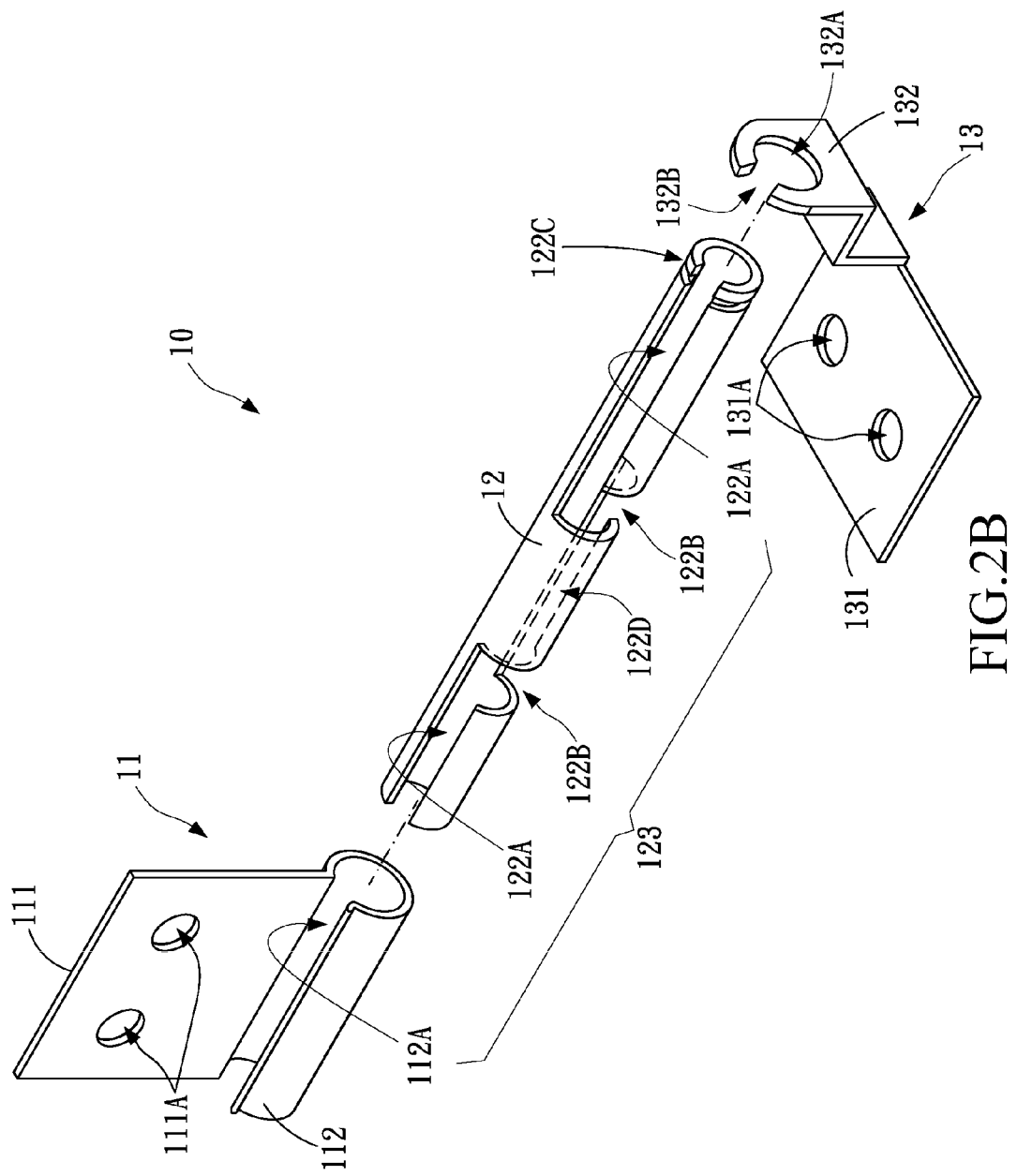
FIG. 2B is a schematic view (2) of a first embodiment of the present invention.

As shown in FIG. 2B, in this embodiment, the other end of the spindle 12 is disposed with a groove 122C, and the first through hole 132A includes a first notch 132B. When the spindle 12 is inserted in the first through hole 132A through the groove 122C, the first notch 132B and the opening position of the second sectioned groove 122A correspond to each other and are thus linked, so that the signal cable 20 can be placed in and one end of the wire is pulled out from the end of the spindle.

According to the structural design described previously, as the first sleeve 112 of the whole hinge assembly 10 forms with the spindle 12 a link channel linked to the hollow space, the wire of the signal cable 20 is not restrained by the large-volume electrical connectors 21 and 22 at tow ends, and can be easily and quickly accommodated in the hollow space of the spindle 12 through the link channel 123 formed above. In other words, after the structure of the hinge assembly 10 of the present invention is adopted, the assembly factory can directly purchase the signal cable 20 connected to electrical connectors 21 and 22 at two ends, and line assembly operators can directly press the wire in the link channel 123 to quickly complete the assembly of the signal cable 20 and the hinge assembly 10, and no longer need the complicated process of placing the wire of the signal cable 20 through the spindle 12 of the hinge assembly 10 and then connecting and assembling the electrical connectors 21 and 22 in a conventional manner, or are no longer subjected to the troubles and low cost-effectiveness in the process that hinge assembly suppliers deliver again after assembling the wire of the signal cable 20 and the hinge assembly 10 in another conventional manner.

Figure 4A:
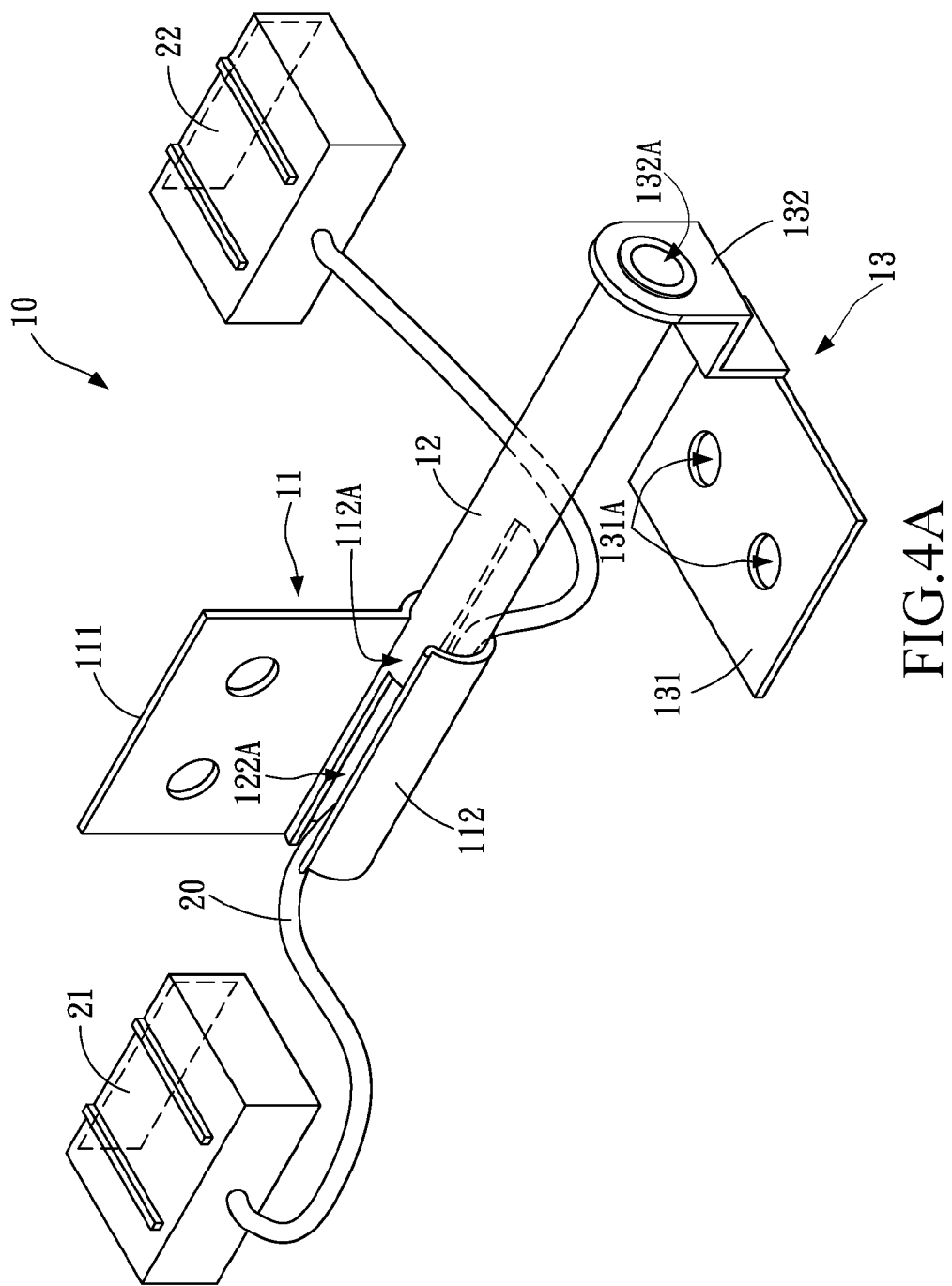
FIG. 4A is a schematic view (1) of a second embodiment of the present invention.
Figure 4B:
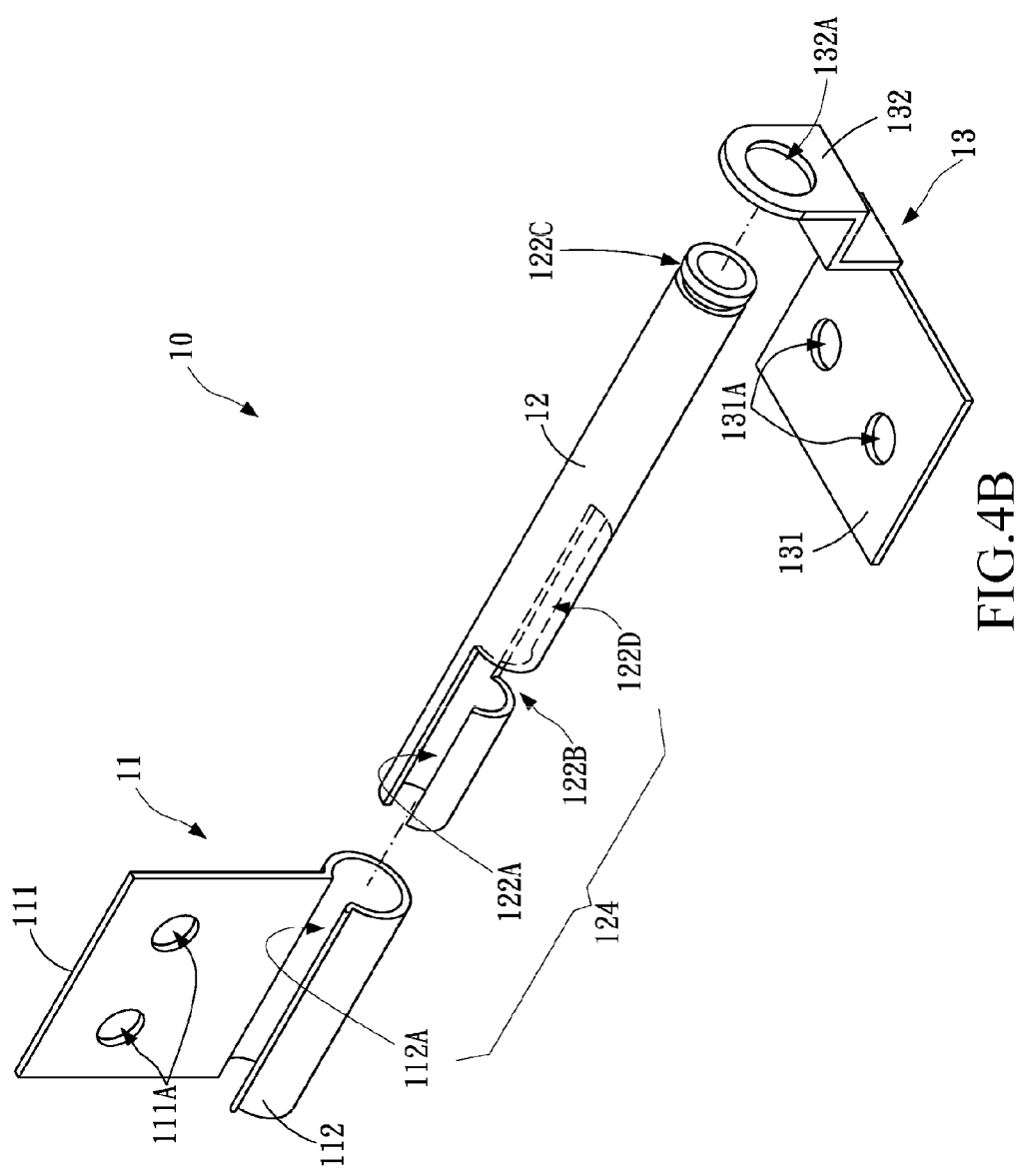
FIG. 4B is a schematic view (2) of a second embodiment of the present invention.

Please refer to FIG. 4A and FIG. 4B, FIG. 4A and FIG. 4B, which are a schematic view (1) and a schematic view (2) of a second embodiment of the present invention, respectively. The main difference between this embodiment and the first embodiment lies in that the second sectioned groove 122A of the spindle 12 extends from one end of the first sleeve 112, and does not run through and extend to the other end of the spindle 12, but instead forms a radial cutting groove 122B at the other end of the second sectioned groove 122A. Therefore, in this embodiment, the first sectioned groove 112A, the second sectioned groove 122A, the cutting groove 122B, and the third sectioned groove 122D form a link channel 124. Therefore, after the signal cable 20 is placed from the link channel 124, one end of the wire is pulled out from the open end of the first sleeve 112 while the other end of the wire is pulled out from the middle of the spindle 12. The effects and advantages of this embodiment are the same as the foregoing first embodiment, which are no longer described here and also in the embodiments below.

Figure 5:
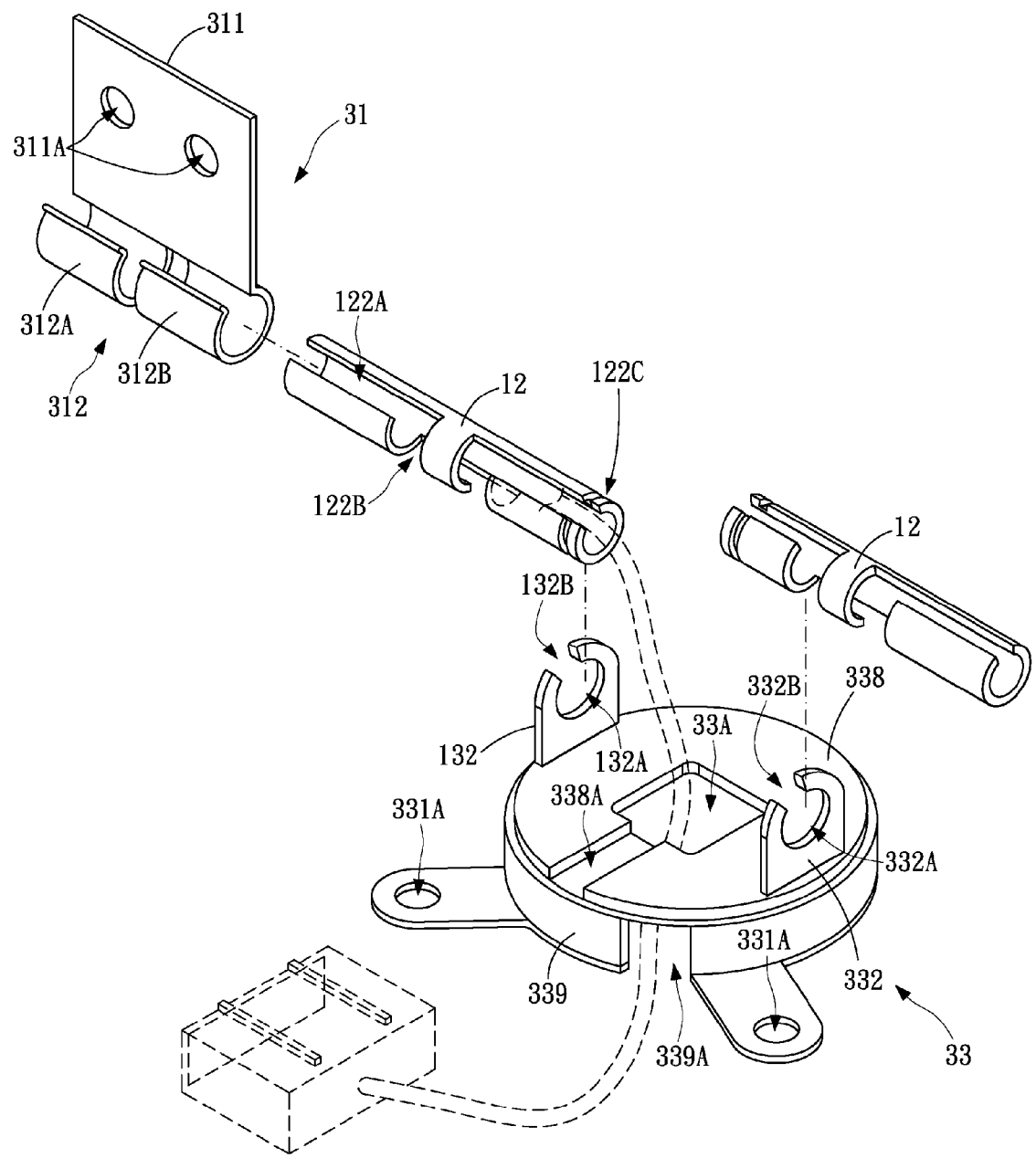
FIG. 5 is a schematic view of a third embodiment of the present invention.

Please refer to FIG. 5, which is a schematic view of a third embodiment of the present invention. The difference between this embodiment and the first embodiment lies in that the second bearing block 33 further includes a first member 338 and a second member 339 that are superposed. The first member 338 is joined with the second member 339 in a rotatable manner to horizontally rotate relative to the second member 339. The center of the first member 338 and the second member 339 has a linked through hole 33A. The first tongue 132 is disposed on the first member 338, and the first member 338 further includes a second tongue 332 and a radial forth sectioned groove 338A. The second tongue 332 is disposed at an interval relative to the first tongue 132. The second member 339 further includes a radial fifth sectioned groove 339A. When the first member 338 rotates to make the forth sectioned groove 338A align with the fifth sectioned groove 339A of the second member 339, the forth sectioned groove 338A and the fifth sectioned groove 339A can be linked to form another link channel so that the signal cable 20 pulled out from one end of the spindle 12 can be placed in the through hole 33A from outside to inside.

The second tongue 332 in this embodiment has a second through hole 332A and a second notch 332B, in which the second notch 332B is linked to the second through hole 332A and the edge of the second tongue 332. A spindle of another hinge assembly can be inserted in the second through hole 332A. In addition, the first bearing block 31 includes a first fixing plate 311 and a first sleeve 312, the first sleeve 312 includes a first sleeving portion 312A and a second sleeving portion 312B, and the first sleeving portion 312A and the second sleeving portion 312B are separated by an interval.

In this embodiment, the second bearing block 33 is still locked on the main unit base 98 through the screw hole 331A, and the first bearing block 31 is still locked on the display screen 99 through the screw hole 311A. What is slightly different from the notebook computer product in which the first embodiment is applied is that in this embodiment, through the characteristic of horizontal rotation of the second bearing block 33, the display screen 99 can vertically turn over relative to the main unit base 98, and horizontal turn over relative to the main unit base 98, so that the use of the notebook computer can switch between the conventional notebook computer mode and the tablet computer mode.

Figure 6:
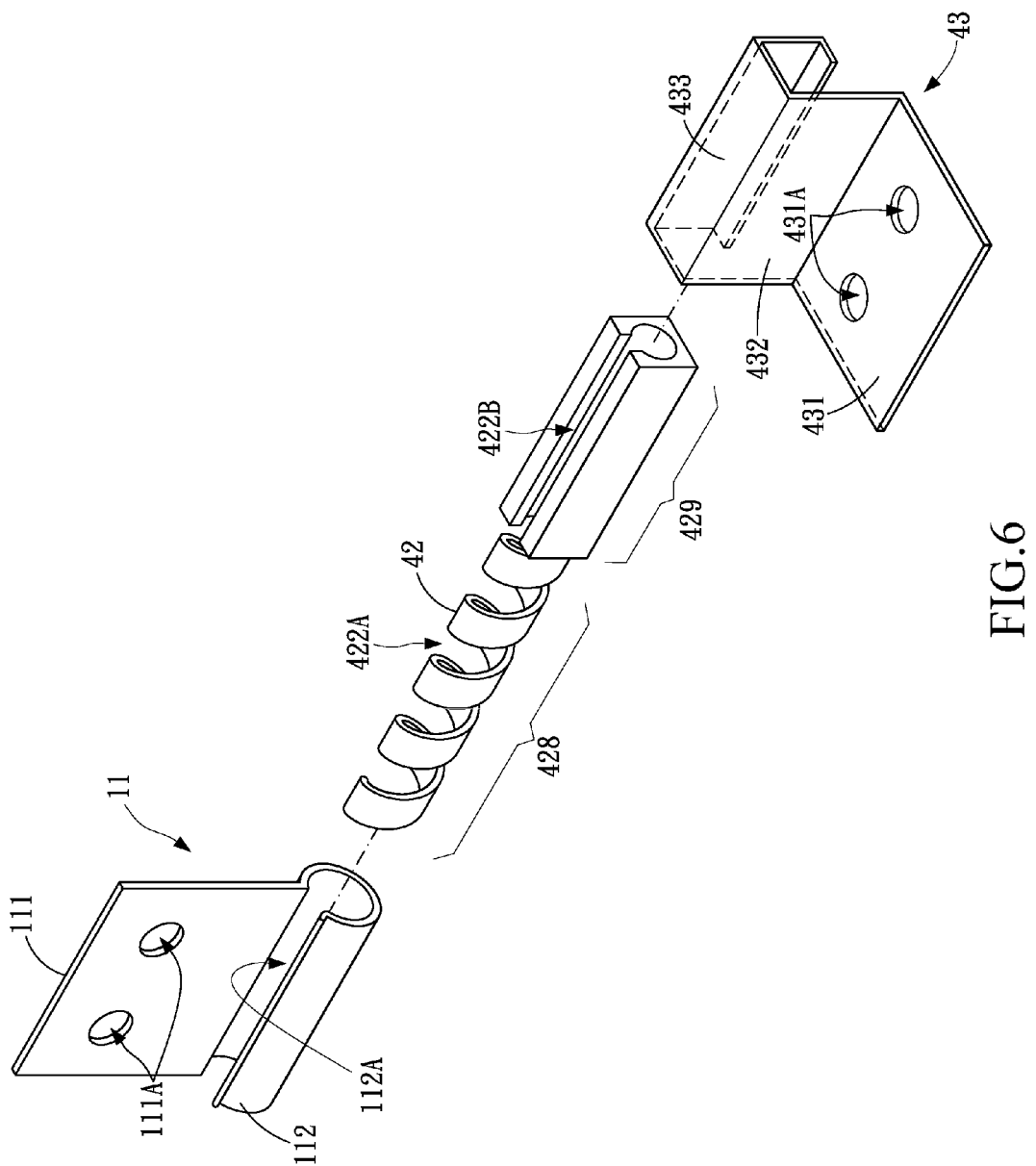
FIG. 6 is a schematic view of a forth embodiment of the present invention.

Please refer to FIG. 6, which is a schematic view of a forth embodiment of the present invention. In this embodiment, a cross section of a first segment 428 of the spindle 42 is circular, and a cross section of a second segment 429 is quadrilateral. The second bearing block 43 includes a second fixing plate 431, an extension plate 432, and a second sleeve 433 with a quadrilateral cross section. The extension plate 432 vertically extends to the second fixing plate 431, and the second sleeve 433 is connected to a side edge of the extension plate 432. The second segment with a quadrilateral cross section of the spindle 42 is inserted in the second sleeve 433 and is enclosed and fixed by the second sleeve 433. In addition, the first segment 428 with a circular cross section of the spindle 42 has a spiral second sectioned groove 422A opened in the spiral and axial extension, and on the second segment 429 with a quadrilateral cross section of the spindle 42, a sixth sectioned groove 422B opened in an axial and linear manner is provided, and the spiral second sectioned groove 422A is linked to the sixth sectioned groove 422B. In this way, the wire of the signal cable 20 can be wound inside along the spiral second sectioned groove 422A and placed in from the linear sixth sectioned groove 422B, and is finally joined in the hinge assembly.

In practice, in the structure in this the embodiment, the second segment 429 of the spindle 42 does not have to be disposed with the sixth sectioned groove 422B, the signal cable 20 only needs to be wound inside along the spiral second sectioned groove 422A and can be then pulled out from one end of the second segment 429, namely, pulled out from the middle segment of the spindle 42.

Figure 7:
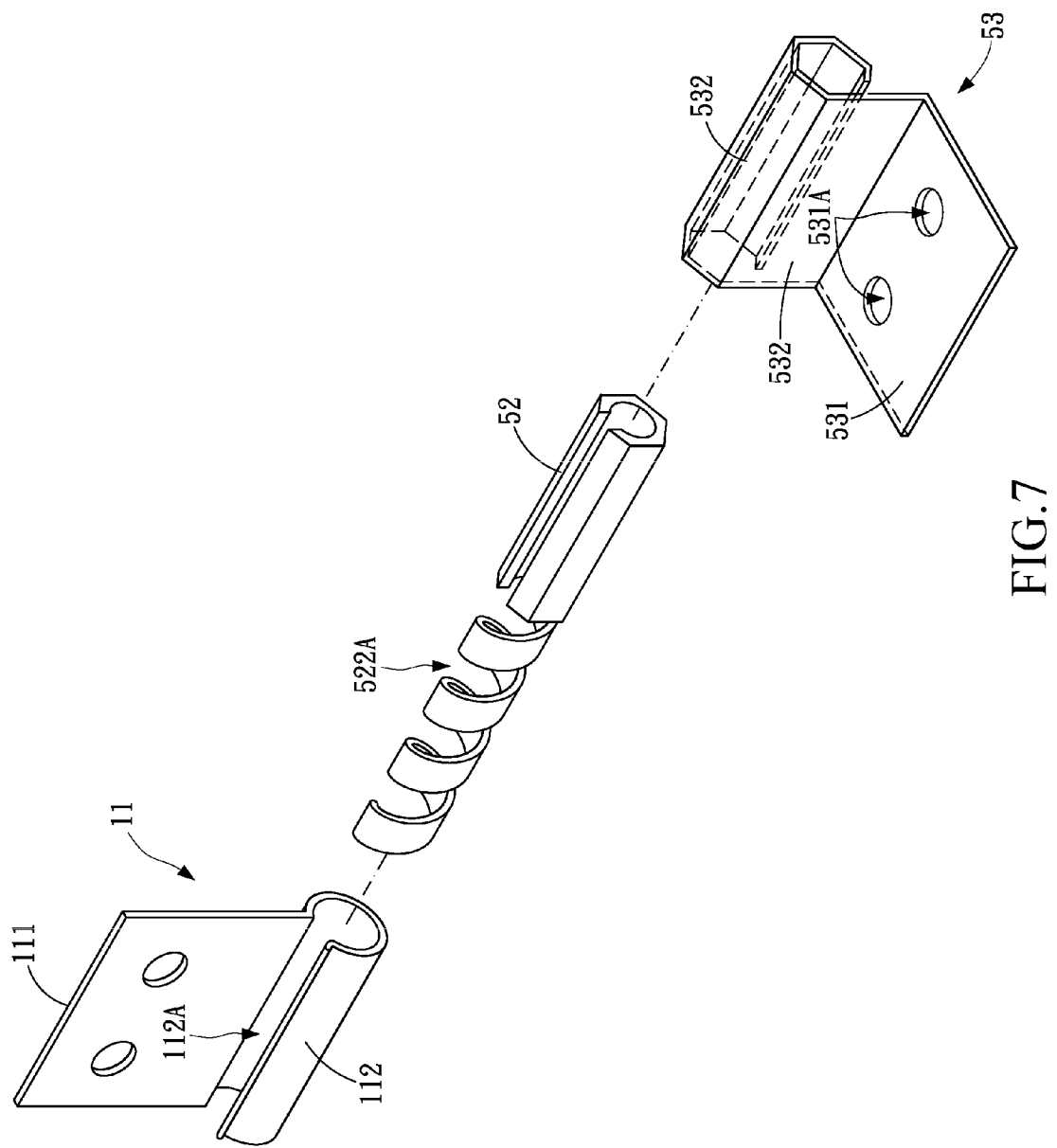
FIG. 7 is a schematic view of a fifth embodiment of the present invention.

Please refer to FIG. 7, which is a schematic view of a fifth embodiment of the present invention. The main difference between this embodiment and the forth embodiment lies in that the cross section of the second sleeve 532 of the second bearing block 53 is hexagonal, and the second sectioned groove 522A of the spindle 52 is also spiral, and the cross section of one of the segments is hexagonal.

In the forth embodiment and the fifth embodiment, the cross section of the second sleeve is polygonal, in which the second segment of the spindle with a polygonal section can be inserted to fix the spindle.

Figure 8A:
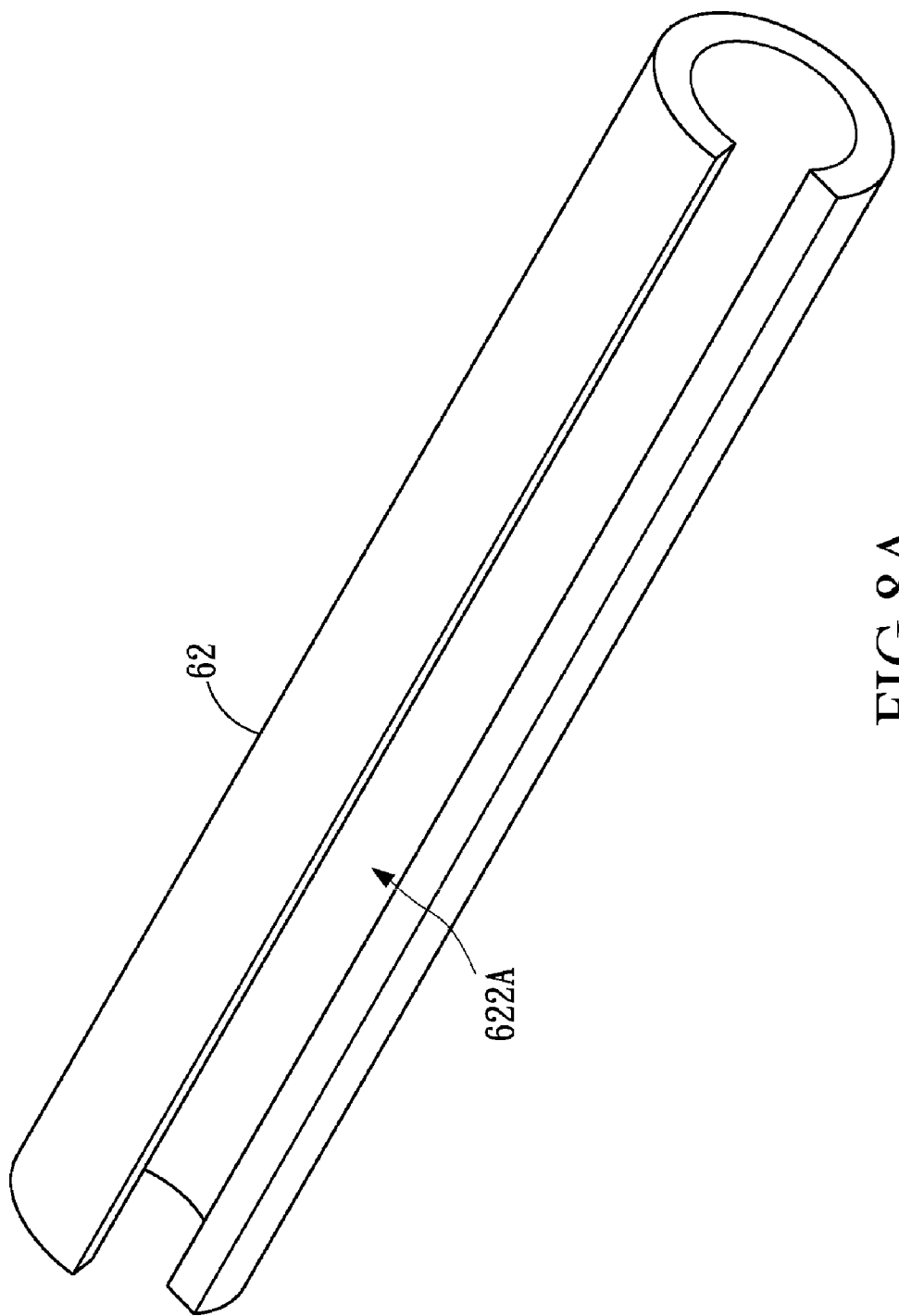
FIG. 8A is a schematic view (1) of a part of components according to a specific embodiment of the present invention.
Figure 8B:
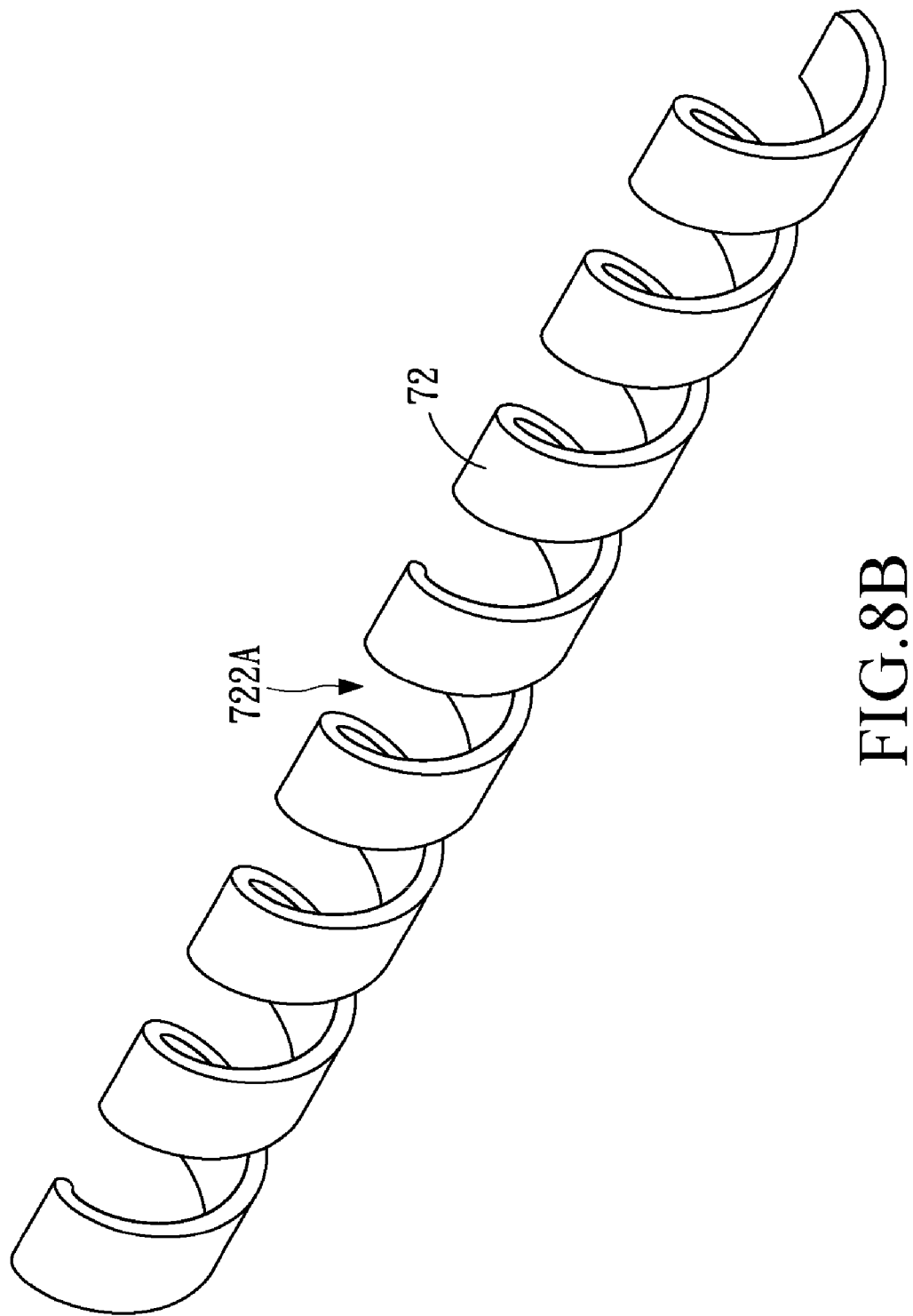
FIG. 8B is a schematic view (2) of a part of components according to a specific embodiment of the present invention.

Please refer to FIG. 8A and FIG. 8B, which are a schematic view (1) and a schematic view (2) of a part of components according to a specific embodiment of the present invention, in which a spindle 62 and a spindle 72 are disclosed, respectively. The spindle 62 is hollow, and the second sectioned groove 622A is linear in an axial direction and is linked to two ends of the spindle 62. In the spindle 72, the second sectioned groove 722A extends in an axial and spiral manner and is linked to two ends of the spindle 72. For both spindles, a signal cable can be placed in from one end and pulled out from the other end.

Figure 9:
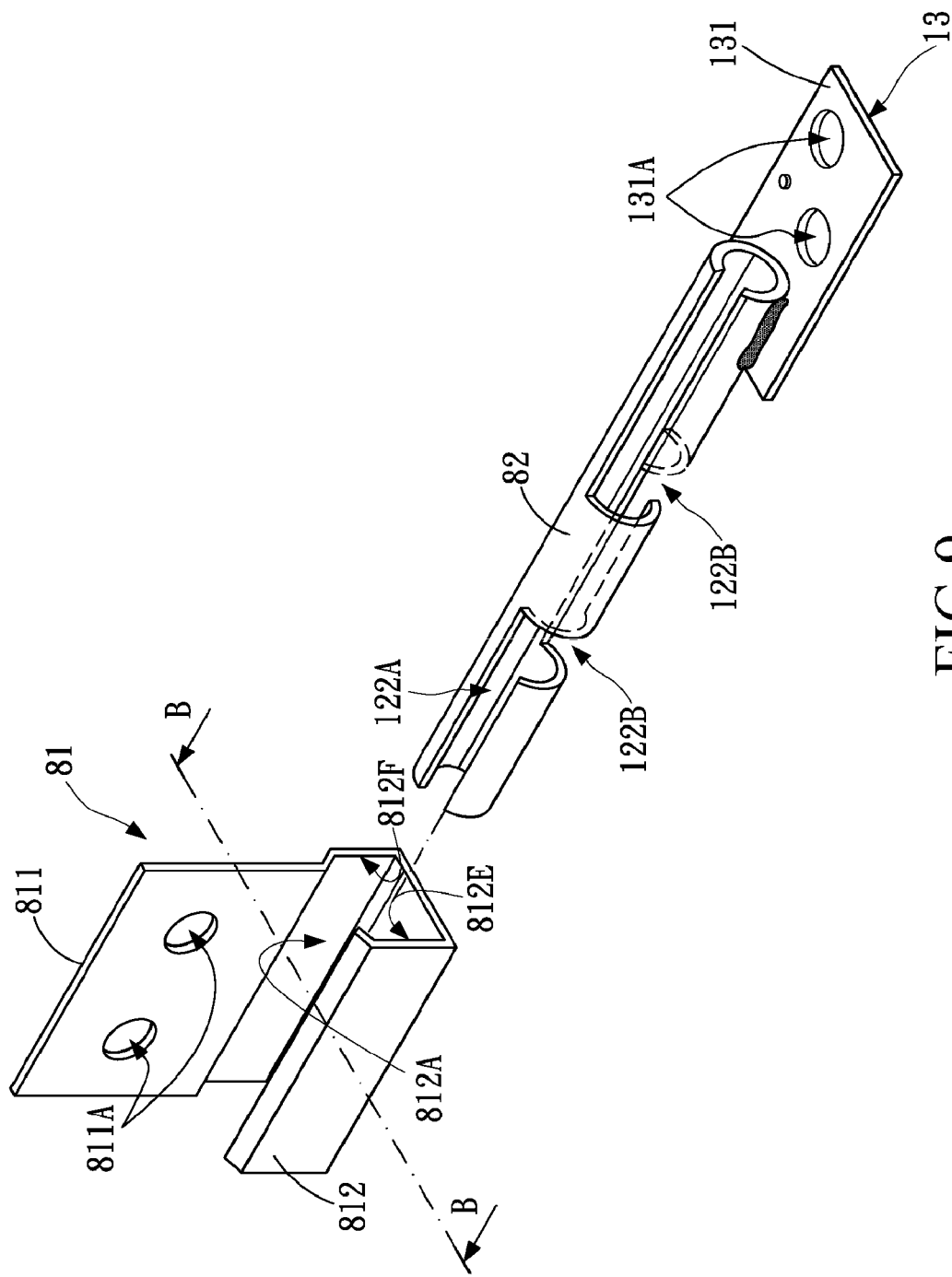
FIG. 9 is a schematic view of a sixth embodiment of the present invention.
Figure 10:
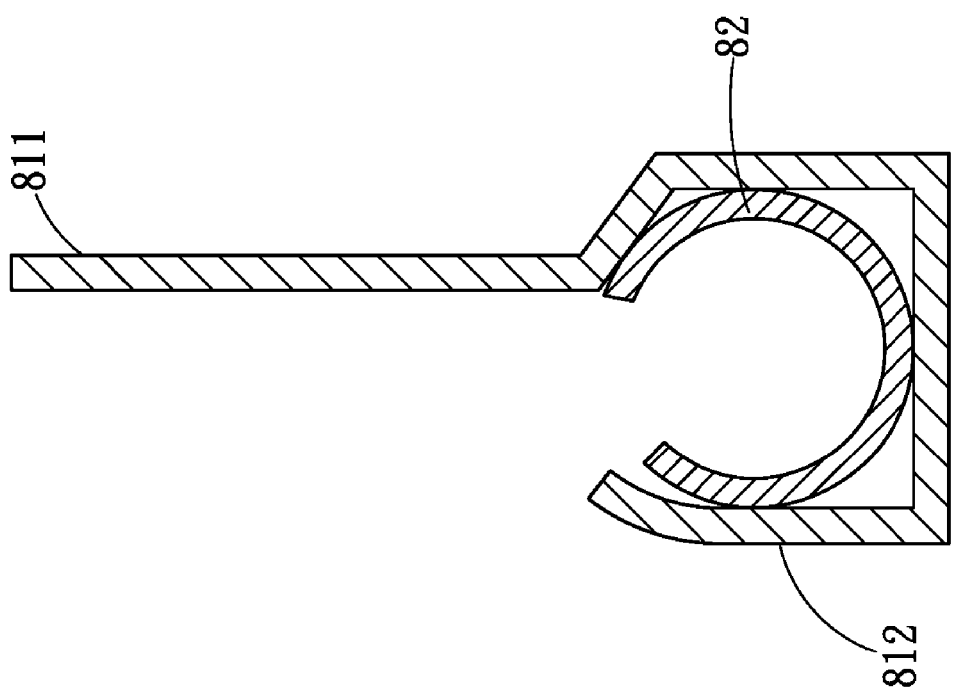
FIG. 10 is a schematic sectional view along a section line BB in FIG. 9.

Please refer to FIG. 9 and FIG. 10, which are a schematic view of the sixth embodiment of the present invention and a schematic sectional view along a section line BB in FIG. 9, respectively. The main difference between this embodiment and the foregoing embodiment lies in that the first sleeve 812 is not circular but polygonal, namely, has a plane 812E and a plane 812F. In addition, the first sleeve also has a sectioned groove 812A. Therefore, the rotational resistance between the first sleeve 812 and the spindle 82 varies with the rotation angle, and the screen can automatically close through a specific arrangement. One end of the spindle 82 is welded on the second bearing block 13 to be fixedly joined.

Figure 11:
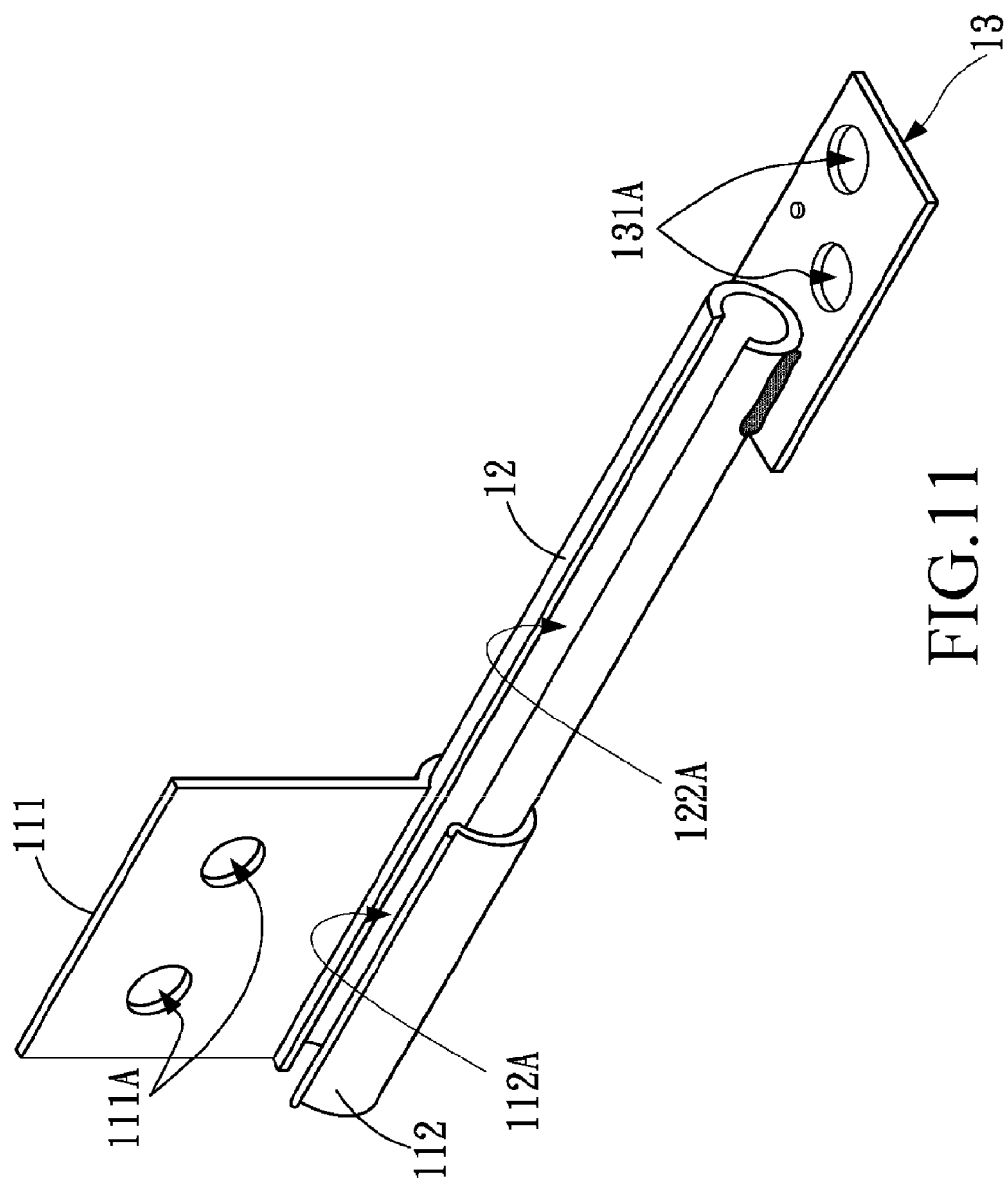
FIG. 11 is a schematic view of a seventh embodiment of the present invention.

Please refer to FIG. 11, which is a schematic view of a seventh embodiment of the present invention. The main difference between this embodiment and the foregoing embodiment lies in that the second sectioned groove 122A is linear and extends to run through two ends of the spindle 12, and one end of the spindle 12 is also welded on the bearing block 13 to be fixedly joined.

Figure 12:
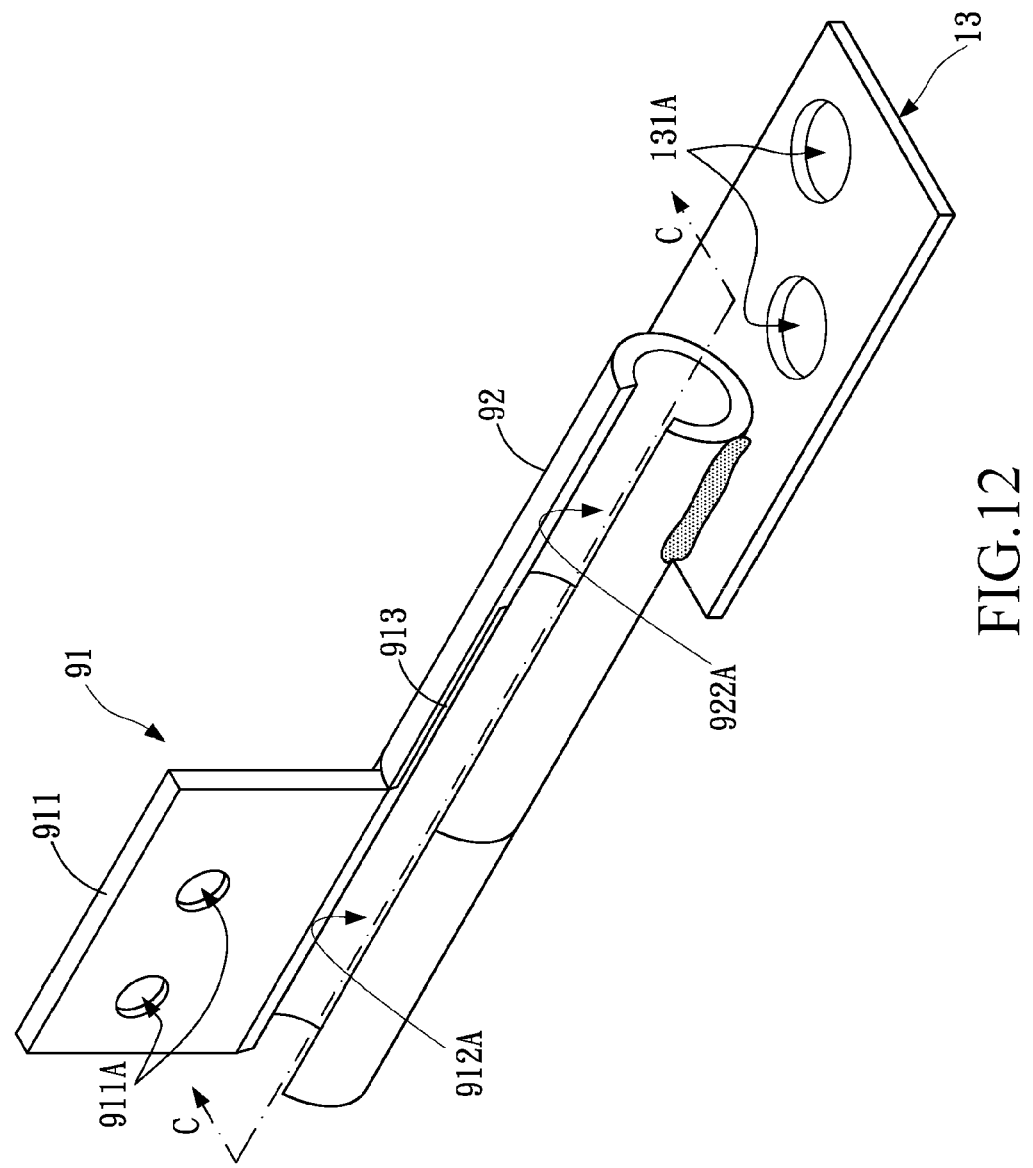
FIG. 12 is a schematic view of an eighth embodiment of the present invention.
Figure 13:
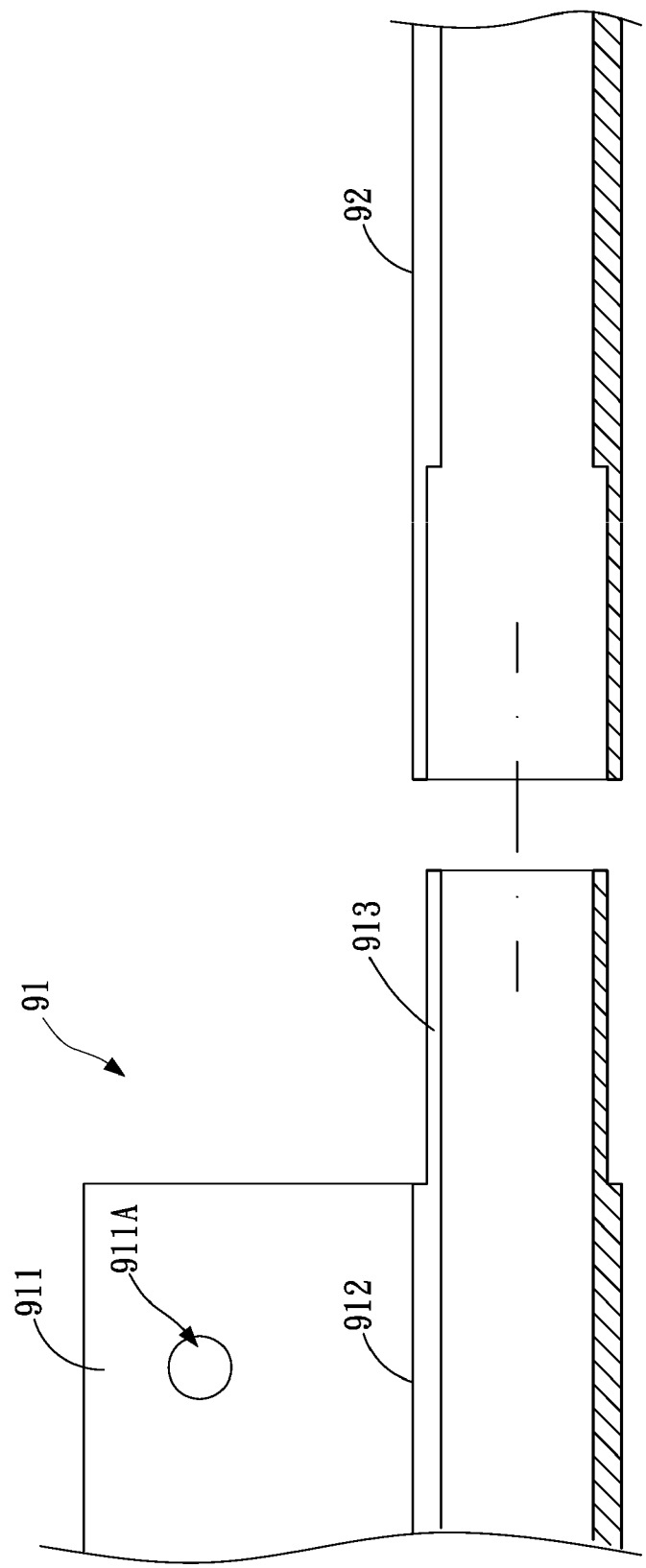
FIG. 13 is a schematic sectional view along a section line CC in FIG. 12.

Please refer to FIG. 12 and FIG. 13, which are a schematic view of the eighth embodiment of the present invention and a schematic sectional view along a section line CC in FIG. 12, respectively. The main difference between this embodiment and the seventh embodiment lies in that one end of the first sleeve 912 and one end of the spindle 92 are sleeved over each other and joined in a rotatable manner. In this way, as long as the first sleeve 912 and the spindle 92 rotate relative to each other to link the first sectioned groove 912A and the second sectioned groove 922A, a link channel in which the wire of the signal cable 20 can be placed is formed. After the wire of the signal cable 20 is placed, the first sleeve 912 and the spindle 92 rotates relative to each other, so that the first sectioned groove 912A and the second sectioned groove 922A are not linked, and the wire of the signal cable 20 can be fixed in the link channel formed by the first sectioned groove 912A and the second sectioned groove 922A. In an implementation aspect, the first sleeve 912 has a joining end 913 with an outside diameter smaller than the inside diameter of the hollow spindle 92, and the spindle 92 is sleeved over to the joining end 913, as shown in FIG. 13. In additional, the arrangement can be opposite, namely, the spindle 92 has a joining end with an outside diameter smaller than the inside diameter of the first sleeve 912, so that the first sleeve 912 is sleeved over the spindle 92.

It is noted that, the foregoing embodiments are described by the example that the first bearing block is fixed on the display screen while the second bearing block is fixed on the main unit base, namely, the first bearing block can rotate relative to the spindle with the rotation of the display screen, but the second bearing block and the spindle are fixed. Persons of ordinary skill in the art can easily infer that the roles or positions of the first bearing block and the second bearing block are exchangeable, which still falls within or is equivalent to the scope of the present invention.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A hinge assembly, for a signal cable to pass through, two ends of the signal cable are connected with an electrical connector, respectively, and the hinge assembly comprises:
   a first bearing block, having a first fixing plate and a first sleeve, wherein the first sleeve is hollow and has a first sectioned groove axially extending and linked to a hollow space therein;
   a second bearing block; and
   a spindle, wherein one end is joined with the first sleeve in a rotatable manner, and the other end is fixed on the second bearing block; wherein at least the one end of the spindle adjacent to the first sleeve is hollow and has an axially extending second groove, such that when the spindle is joined with the first sleeve and rotated relative to the first sleeve to a proper position, the first sectioned groove and the second sectioned groove are linked to form a link channel in which the wire of the signal cable is placed to be accommodated in the hollow space of the first sleeve and the spindle.

2. The hinge assembly according to claim 1, wherein the second bearing block comprises a second fixing plate and a first tongue, the first tongue is formed by vertically extending from the second fixing plate, the first tongue has a first through hole, and the other end of the spindle far away from the first bearing block is fixed at the first through hole.

3. The hinge assembly according to claim 2, wherein a side of the first through hole of the first tongue further comprises a first notch linked to the first through hole.

4. The hinge assembly according to claim 1, wherein the second bearing block comprises a first member and a second member that are superposed and rotatable horizontally, and a second member, and the center of the first member and the second member has a linked through hole; and
   the first member comprises a first tongue and a radial forth sectioned groove, and the first tongue has a first through hole to fix the other end of the spindle far away from the first bearing block;
   the second member comprises a radial fifth sectioned groove, and when the first member and the second member rotate relative to each other to a proper position, the forth sectioned groove and the fifth sectioned groove are linked to each other to form another link channel where the signal cable from the second sectioned groove of the spindle is placed to be located in a central through hole.

5. The hinge assembly according to claim 4, wherein the first member further comprises a second tongue disposed at an interval relative to the first tongue, the first tongue has a first notch linked to the first through hole, and the second tongue also has a second through hole and a second notch linked to the second through hole.

6. The hinge assembly according to claim 1, wherein the second bearing block comprises a second fixing plate, an extension plate, and a second sleeve, the extension plate is formed by extending vertically from the second fixing plate, the second sleeve is connected to a side edge of the extension plate, and the other end of the spindle far away from the first bearing block is fixed on the second sleeve.

7. The hinge assembly according to claim 1, wherein the second sectioned groove extends through two ends of the spindle.

8. The hinge assembly according to claim 1, wherein the second sectioned groove is only disposed at the part of one end of the spindle near the first bearing block.

9. The hinge assembly according to claim 7, wherein the second sectioned groove is disposed in spiral extension in an axial direction of the spindle.

10. The hinge assembly according to claim 8, wherein the second sectioned groove is disposed in spiral extension in an axial direction of the spindle.

11. The hinge assembly according to claim 7, wherein the second sectioned groove extends in a straight line.

12. The hinge assembly according to claim 8, wherein the other end of the second sectioned groove far away from the first bearing block further has a cutting groove that extends in a radial direction and is linked.

13. The hinge assembly according to claim 7, wherein the second sectioned groove further has two radial cutting grooves disposed at an interval and a third sectioned groove axially disposed at proper positions of the middle to forming a U-shaped bend, the third sectioned groove and the second sectioned groove are staggered and not in a single straight line, and the second sectioned groove, the two cutting grooves, and the third sectioned groove are formed in a linked state.

14. The hinge assembly according to claim 1, wherein the first sleeve has a first sleeving portion and a second sleeving portion, and the first sleeving portion and the second sleeving portion are separated by an interval.

15. The hinge assembly according to claim 8, wherein the spindle comprises a first segment near the first bearing block and a second segment near the second bearing block, a cross section of the first segment is circular and has the second sectioned groove extending in a spiral and axial manner, a cross section of the second segment is polygonal and has a sixth sectioned groove extending in an axial and linear manner, and the second sectioned groove is linked to the sixth sectioned groove.

16. The hinge assembly according to claim 15, wherein the second bearing block comprises a second fixing plate, an extension plate, and a polygonal second sleeve, the extension plate is formed by extending vertically from the second fixing plate, the second sleeve is connected to a side edge of the extension plate, and the polygonal second segment of the spindle is inserted in the polygonal second sleeve to be fixed.

17. The hinge assembly according to claim 1, wherein the other end of the spindle far away from the first bearing block is welded and fixed on the second bearing block.

18. The hinge assembly according to claim 1, wherein a cross section of the first sleeve of the first bearing block is circular, and a cross section of one end of the spindle near the first sleeve is also circular.

19. The hinge assembly according to claim 1, wherein a section of the first sleeve of the first bearing block is approximately polygonal, and a cross section of one end of the spindle near the first sleeve is also circular.

20. The hinge assembly according to claim 1, wherein one end of the first sleeve of the first bearing block near the spindle has a joining end with a small outside diameter to be sleeved in one end near the spindle to reach a rotation combination.

21. An electronic device, comprising:
   a main unit base;
   a display screen; and a hinge assembly, adapted for pivotally connecting the display screen on the main unit base, comprising:
  a first bearing block fixed on the display screen, having a first fixing plate and a first sleeve, wherein the first sleeve is hollow and has a first sectioned groove axially extending and linked to a hollow space therein;
  a second bearing block fixed on the main unit base; and
  a spindle, wherein one end is joined with the first sleeve in a rotatable manner, and the other end is fixed on the second bearing block; wherein at least the one end of the spindle adjacent to the first sleeve is hollow and has an axially extending second groove, such that when the spindle is joined with the first sleeve and rotated relative to the first sleeve to a proper position, the first sectioned groove and the second sectioned groove are linked to form a link channel; and
a signal cable, having a wire and two electrical connectors disposed at two ends of the wire, the wire is placed in the link channel to be accommodated in the hollow space of the first sleeve and the spindle, and the two electrical connectors are connected to the main unit base and the display screen, respectively.

22. The electronic device according to claim 21, wherein the second bearing block comprises a second fixing plate and a first tongue, the first tongue is formed by extending vertically from the second fixing plate, the first tongue has a first through hole, and the other end of the spindle far away from the first bearing block is fixed in the first through hole.

23. The electronic device according to claim 22, wherein a side of the first through hole of the first tongue further comprises a first notch linked to the first through hole.

24. The electronic device according to claim 21, wherein the second bearing block comprises a first member and a second member that are superposed rotatable horizontally, and the middle of the first member and the second member has a linked through hole, and
  the first member comprises a first tongue and a radial forth sectioned groove, and the first tongue has a first through hole to fix the other end of the spindle far away from the first bearing block; and
  the second member comprises a radial fifth sectioned groove, and when the first member and the second member rotate relative to each other to a proper position, the forth sectioned groove and the fifth sectioned groove are linked to each other to form another link channel where the signal cable from the second sectioned groove of the spindle is placed to be located in a central through hole.

25. The electronic device according to claim 24, wherein the first member further comprises a second tongue disposed at an interval relative to the first tongue, the first tongue has a first notch linked to the first through hole, and the second tongue also has a second through hole and a second notch linked to the second through hole.

26. The electronic device according to claim 21, wherein the second bearing block comprises a second fixing plate, an extension plate, and a second sleeve, the extension plate is formed by extending vertically from the second fixing plate, the second sleeve is connected to a side edge of the extension plate, and the other end of the spindle far away from the first bearing block is fixed on the second sleeve.

27. The electronic device according to claim 21, wherein the second sectioned groove extends and run through two ends of the spindle.

28. The electronic device according to claim 21, wherein the second sectioned groove is only disposed on a part of one end of the spindle near the first bearing block.

29. The electronic device according to claim 27, wherein the second sectioned groove is disposed in spiral extension in an axial direction of the spindle.

30. The electronic device according to claim 28, wherein the second sectioned groove is disposed in spiral extension in an axial direction of the spindle.

31. The electronic device according to claim 27, wherein the second sectioned groove extends in a straight line.

32. The electronic device according to claim 28, wherein the other end of the second sectioned groove far away from the first bearing block further has a cutting groove that extends in a radial direction and is linked.

33. The electronic device according to claim 27, wherein the second sectioned groove has two radial cutting grooves disposed at an interval and a third sectioned groove axially disposed at proper positions of the middle, forming a U-shaped bend, the third sectioned groove and the second sectioned groove are staggered and not in a single straight line, and the second sectioned groove, the two cutting grooves, and the third sectioned groove are formed in a linked state.

34. The electronic device according to claim 21, wherein the first sleeve has a first sleeving portion and a second sleeving portion, and the first sleeving portion and the second sleeving portion are separated at an interval.

35. The electronic device according to claim 28, wherein the spindle comprises a first segment near the first bearing block and a second segment near the second bearing block, a cross section of the first segment is circular and has the second sectioned groove extending in a spiral and axial manner, a cross section of the second segment is polygonal and has a sixth sectioned groove extending in an axial and linear manner, and the second sectioned groove is linked to the sixth sectioned groove.

36. The electronic device according to claim 35, wherein the second bearing block comprises a second fixing plate, an extension plate, and a polygonal second sleeve, the extension plate is formed by extending vertical from the second fixing plate, the second sleeve is connected to a side edge of the extension plate, and the polygonal second segment of the spindle is inserted in the polygonal second sleeve to be fixed.

37. The electronic device according to claim 21, wherein the other end of the spindle far away from the first bearing block is welded and fixed on the second bearing block.

38. The electronic device according to claim 21, wherein a cross section of the first sleeve of the first bearing block is circular, and a cross section of one end of the spindle near the first sleeve is also circular.

39. The electronic device according to claim 21, wherein a cross section of the first sleeve of the first bearing block is polygonal, and a cross section of one end of the spindle near the first sleeve is circular.

40. The electronic device according to claim 21, wherein one end of the first sleeve of the first bearing block near the spindle has a joining end with a small outside diameter to be sleeved in one end near the spindle to reach a rotation combination.

* * * * *